US008143956B2

(12) United States Patent
Chen

(10) Patent No.: US 8,143,956 B2
(45) Date of Patent: Mar. 27, 2012

(54) ATOMIC BEAM OPTICAL FREQUENCY ATOMIC CLOCK AND A PRODUCING METHOD THEREOF

(75) Inventor: Jing-Biao Chen, Beijing (CN)

(73) Assignee: Peking University, Beijing (CN)

( * ) Notice: Subject to any disclaimer, the term of this patent is extended or adjusted under 35 U.S.C. 154(b) by 764 days.

(21) Appl. No.: 12/162,303

(22) PCT Filed: Sep. 22, 2006

(86) PCT No.: PCT/CN2006/002501

§ 371 (c)(1), (2), (4) Date: Dec. 8, 2008

(87) PCT Pub. No.: WO2007/073652

PCT Pub. Date: Jul. 5, 2007

(65) Prior Publication Data

US 2009/0180357 A1 Jul. 16, 2009

(51) Int. Cl.

*H03L 7/26* (2006.01)
*H01S 1/06* (2006.01)
*H01S 3/091* (2006.01)

(52) U.S. Cl. ................ 331/3; 331/94.1; 372/70; 372/72

(58) Field of Classification Search ............. 331/3, 94.1; 372/69–74

See application file for complete search history.

(56) References Cited

U.S. PATENT DOCUMENTS 4,454,482 A * 6/1984 DeMarchi ......................... 331/3
4,684,900 A * 8/1987 Avila et al. ........................ 331/3
5,107,226 A 4/1992 Pascaru ............................. 331/3
5,146,185 A * 9/1992 Lewis .............................. 331/3
6,831,522 B2 12/2004 Kitching et al. .................. 331/3

FOREIGN PATENT DOCUMENTS

CN 1786853 6/2006

OTHER PUBLICATIONS

Jingbiao Chen et al., "Two Improved Schemes for Small Ca Beam Optical Frequency Standard" The Time Frequency Science Intercourse Papers, 2005, pp. 121-126.

* cited by examiner

*Primary Examiner* — Levi Gannon

(74) *Attorney, Agent, or Firm* — J.C. Patents

(57) ABSTRACT

An atomic clock at optical frequency based on atomic beam and a method for generating the atomic clock comprises: The atomic beam (8) is ejected from a pile mouth after heating an atomic pile (1) in a vacuum chamber (2); A laser (4) corresponding to frequency of a clock transition transfers the atomic beam (8) from a ground state of the clock transition to an excited state of the clock transition in a adiabatic passing mode; After interaction with the laser corresponding to the frequency of a clock transition, the atomic beam (8) passes a signal detection region with a detection laser (5), and after the interaction with the detection laser (5), each of the atoms gives off a photon of spontaneous emission; An emitted fluorescence photon signal from atoms which is excited by the detection laser (5) is explored; A clock laser (4) for exploring transition frequency of an atomic clock is modulated. The signal which is detected performs frequency locking for the frequency of the clock laser which is locked on the clock transition spectrum of the atoms so as to implement the atomic clock.

15 Claims, 2 Drawing Sheets

ATOMIC BEAM OPTICAL FREQUENCY ATOMIC CLOCK AND A PRODUCING METHOD THEREOF

CROSS-REFERENCE TO RELATED APPLICATION

This application is a national phase of the international application No. PCT/CN2006/02501 filed on Sep. 22, 2006, which claims the priority benefit of China application No. 200510130745.0 filed on Dec. 27, 2005, the content of which is hereby incorporated by reference in its entirety.

FIELD OF THE TECHNOLOGY

The present invention relates to an atomic clock at optical frequency based on atomic beam, which belongs to a technology field of frequency standard at the optical frequency region.

BACKGROUND OF THE INVENTION

The principle of an miniature optical frequency standard based on traditional calcium atomic beam is that, when a calcium oven is heated up to a temperature around 700 centigrade, the heated calcium atomic beam is ejected from the calcium oven and passes a 657 nm laser traveling wave field generated by two pairs of cat eye devices which are parallel with equal interval orderly after collimation. A proper magnetic field is added to the Ramsey interaction region so as to separate different magnetic sublevels in $^3P_1$ state. The $^1S_0$ ground state atoms coming out from the calcium oven is stimulated by π pulse of polarized 657 nm laser in the Ramsey interaction region. The atoms stimulated to mF=0 sub-level in $^3P_1$ state may give off 657 nm fluorescence by spontaneous emission transition. A photoelectric detector measures the 657 nm fluorescence given off by the spontaneous emission transition of the atoms in an excited state at the downstream of atomic beam flow. The miniature atomic clock at optical frequency based on the traditional calcium atomic beam is shown in FIG. 1.

So far, all the atomic clocks of optical frequency based on a heated atomic beam technology are limited by the low signal-to-noise ratio of fluorescence signals with no exception, so that the stability can not be improved and the accuracy that may be achieved is also limited ultimately. At present, the best accuracy that the atomic clock at optical frequency based on the calcium atomic beam may achieve is a little worse than that of a HP5071 small cesium clock so that it can not compete with the commercial HP5071 small cesium clock. The main reason is that the probability of the spontaneous emission of the atoms, only about one thousand photons per second, is very low after the region of 657 nm clock transition interaction used for detection, plus the limited fluorescence collecting area for detection makes that the detection efficiency for the atoms is so low to only around 1% or less. Such low detection efficiency for the atoms greatly limits the accuracy and the stability of the atomic clock that can be implemented.

SUMMARY OF THE INVENTION

The object of the present invention is to implement an atomic clock at optical frequency based on atomic beam for overcoming the disadvantages of the conventional atomic clock at optical frequency based on the atomic beam and the conventional generating device thereof in the prior art, which can improve the atoms detection efficiency.

In order to implement the above object, the present invention provides a method for generating an atomic clock at optical frequency based on atomic bean, including the following steps:

Atomic beam is ejected from a mouth of oven after heating an atomic oven in a vacuum chamber;

Laser corresponding to frequency of a clock transition transfers particles in the atomic beam from a ground state of the clock transition to an excited state of the clock transition in an adiabatic passing mode;

After the atomic beam interacts with the laser corresponding to the frequency of the clock transition in the form of single field or separate field, the atomic beam passes a signal detection region with a detection laser, and frequency of the detection laser corresponds to one strong transition spectral line related to a transition energy level of an atomic clock; After the particles in the atomic beam moves to the detection region and interacts with the detection laser, each of the atoms gives off photons of spontaneous emission; And each emitted fluorescence photon signal excited by the detection laser is explored by using a photoelectric receiving system;

Clock laser exploring transition frequency of an atomic clock is modulated by using a modulating method, the detected signal performs frequency locking at frequency of the clock laser, and the frequency of the clock laser is locked at a clock transition spectrum of the atoms so as to implement an atomic clock.

An angle is formed between said detection laser and the atomic beam. The atoms with a certain velocity group are chosen for detecting by adjusting the frequency and the line width of the detection laser or adjusting the divergence angle of the laser beam. Flow of said atomic beam can be different kinds of atoms, molecules or ions.

The present invention also provides an atomic clock at optical frequency based on atomic beam, including: a vacuum cavity is provided with an atomic oven in the vacuum cavity, a pump laser device and a cat eye optical path vertical with an atomic beam and composed of two holophotes and two lenses, a servo circuit connected to the atomic oven for controlling the temperature of the atomic oven, a detection laser, a clock laser, and a photoelectric detecting device;

The atomic oven is placed inside the vacuum cavity and the temperature of the atomic oven is controlled by the connected servo circuit; the atomic beam generated after heating the atomic oven inside the vacuum cavity intercrosses with the clock laser and interacts with each other. At the offside of the interaction area, the atomic beam continues intercrossing with the detection laser and interacting with each other to emit fluorescence; the emitted fluorescence is received by the photoelectric detecting device placed in a detection region, transferred to the connected servo circuit and fed back to the clock laser by the servo circuit, and finally the frequency of the clock laser is stabilized to the frequency corresponding to the clock transition spectral line of the atoms;

The atomic beam is ejected from the atomic oven, enters a pump region to interact with a pump light after collimation, and then interacts with a clock transition laser in the form of single interaction region or multiple interaction region. A great deal of fluorescence photons emitted by the atoms are explored by a photoelectric receiving system after the atoms move to the detection region and interacts with the detection laser. The detection laser is a laser corresponding to one strong transition line related to a transition energy level of the atomic clock transition.

Said servo circuit is a servo circuit for the system to control the performance of output frequency of the atomic clock. Said detection laser and clock laser device are provided with a frequency automatic controlling circuit. A small hole diaphragm is set in said vacuum cavity for collimating the atomic beam. Said vacuum cavity is provided with multiple optical windows for the input and the output of the laser. The vacuum degree inside said vacuum cavity is greater than $10^{-2}$ torr.

The present invention improves the atoms detection efficiency by using a detection method of electron shelving detection technology, that is, using the laser corresponding to one strong transition line related to the transition energy level of the atomic clock for detection. Thereby it ensures that each of the atoms which need to be detected can be measured in a 100% rate. Secondly, the signal fringe contrast is improved to increase the signal-to-noise ratio by using the detection method that an angle is formed between the detection laser beam and the atomic beam chooses the atoms with certain velocity group on the atomic clock at optical frequency based on the atomic beam type for detection. Thirdly, the atoms are firstly pumped to the excited state of the clock transition by using the pumping technology in advance so as to implement the atomic clock at optical frequency based on new atomic beam type with the process of emitting the electromagnetic wave by excited the atoms.

NUMERICAL DESCRIPTION

Figure 1:
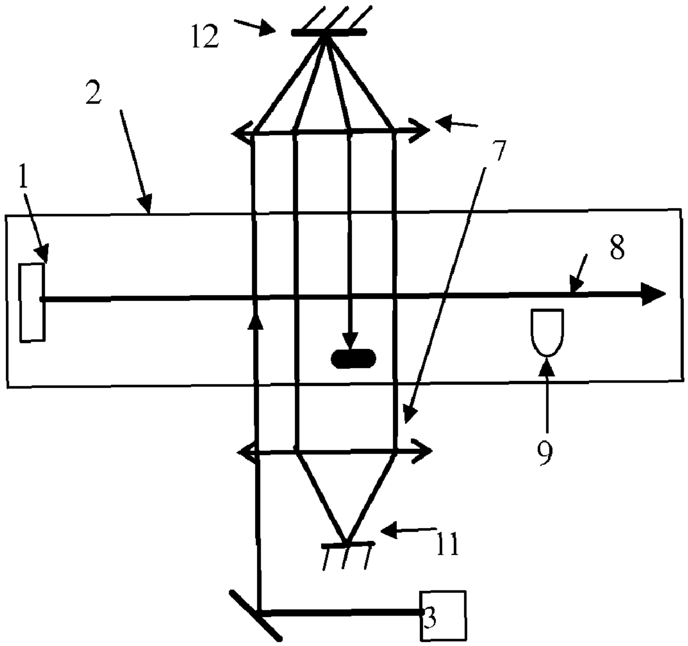
Fig. 1 (PRIOR ART)
FIG. 1 is the structure view of an atomic clock at optical frequency based on an atomic beam type in prior art.

1—atomic oven;
2—vacuum cavity;
3—frequency shifter;
4—clock transition laser (i.e. clock laser which is 657 nm for calcium atoms);
5—detection laser (which is 423 nm for calcium atoms);
6—system servo circuit;
7—lens 1 and lens 2 in the cat eye optical structure;
8—particle beam;
9—photoelectric detector;
10—diaphragm collimator;
11, 12—total reflective mirror;
13—pump laser beam;
14—clock transition laser;
15—photon shutter The present invention will be described in more detail with reference to the drawings and embodiments.

DETAILED DESCRIPTION OF THE PREFERRED EMBODIMENTS

The atomic clock at optical frequency based on atomic beam in accordance with the present invention includes the following steps.

Atomic beam is ejected from a mouth of oven after heating an atomic oven in a vacuum chamber;

Laser corresponding to frequency of a clock transition transfers particles in the atomic beam from a ground state of the clock transition to an excited state of the clock transition operates in an adiabatic passing mode;

After interacting with the laser corresponding to the frequency of the clock transition in the form of single field or separate field, the atomic beam passes a signal detection region with a detection laser using electron shelving detection. The frequency of the detection laser corresponds to one strong transition spectral line related to a transition energy level of an atomic clock. After the particles in the atomic beam moves to the detection region and interacts with the detection laser, each of the atoms gives off a photon of spontaneous emission once excited by the detection laser. And each emitted fluorescence photon signal which is stimulated by the detection laser then decay is explored by using a photoelectric receiving system;

The exploring transition frequency of clock laser of an atomic clock is modulated by using a modulating method. The detected signal performs frequency locking on the frequency of clock laser, and the frequency of the clock laser is locked on a clock transition spectrum of the atoms so as to implement an atomic clock.

The detection method for electron shelving detection technology, i.e. the laser corresponding to one strong transition line related to the transition energy level of the atomic clock, is used for detection. Taking the calcium atoms as an example, the laser of which the wavelength is 423 nm stimulates the $^1S_0$ ground state atoms of the clock transition to the first excited state $^1P_1$ of the atoms singlet state in the detection region. The probability of the atoms spontaneous emission in the first excited state $^1P_1$ is very high, up to 34 million photons radiated per atoms per second. Thereby, it ensures that each of the atoms needing to be detected can be measured in 100% rate. For magnesium atoms, they are detected by using a 285 nm laser.

The signal fringe contrast is improved to increase the signal-to-noise ratio by using the detection method that an angle is formed between the detection laser beam and the atomic beam chooses the atoms with a certain velocity group on the atomic clock at optical frequency based on the atomic beam type for detection.

The atoms are pumped to the excited state of the clock transition by using the pumping technology in advance so as to implement the atomic clock at optical frequency based on the new atomic beam type with the process of emitting the electromagnetic wave by stimulating the atoms.

The atomic beam flow is placed in the vacuum cavity. The atomic beam flow comprises different kinds of atoms, molecules or ions.

The atomic clock at optical frequency based on atomic beam in the present invention includes:

a vacuum cavity provided with an atomic oven, a pump laser device and a cat eye optical path which is vertical with the atomic beam and composed of two holophote and two lenses;

a servo circuit connected to the atomic oven for controlling temperature of the atomic oven;

a detection laser;

a clock laser; and a photoelectric detecting device.

The atomic oven is placed in the vacuum cavity and the temperature of the atomic oven is controlled by the connected servo circuit. The atomic beam generated after heating the atomic oven in the vacuum cavity intercrosses with the clock laser and interacts with each other. At the offside of the action area, the atomic beam continues intercrossing with the detection laser and interacting with each other to emit fluorescence. The emitted fluorescence is received by the photoelectric detecting device placed in a detection region, transferred to the connected servo circuit and fed back to the clock laser via the servo circuit, and finally the frequency of the clock laser is stabilized to the frequency corresponding to the clock transition spectral line of the atoms;

The atomic beam is ejected from the atomic oven, after collimation, enters the pump region to interact with the pump light, and then interacts with the clock transition laser in the form of single interaction region or multiple interaction regions. A great deal of fluorescence emitted by the atoms is explored by the photoelectric receiving system after the atoms move to the detection region and acts with the detection laser. The detection laser is a laser which corresponds to one strong transition line related to a transition energy level of the atomic clock.

The specific embodiment is explained by taking the calcium atoms as an embodiment. However it is not just limited to the calcium atoms; it may be other atoms or molecules, for example magnesium atoms.

Small pieces of calcium metal are placed in the oven and heated to about 650 centigrade. The calcium atoms are ejected out of a tubule to form the atomic beam and the highest velocity is about 800 meters per second. Firstly, the structure without pumping in advance is explained.

Figure 2:
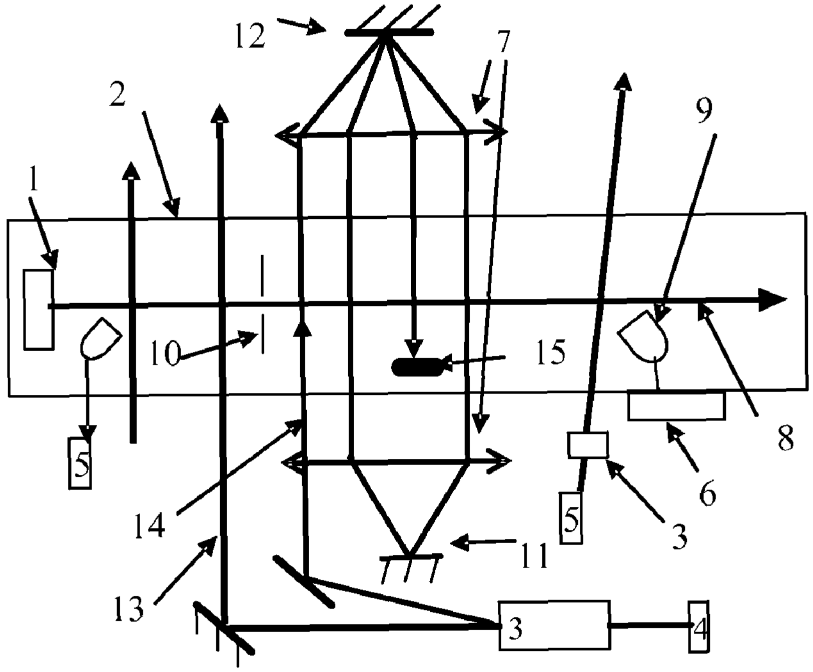
FIG. 2 is the structure view of the generating device of an atomic clock at optical frequency based on atomic beam according to the present invention.

The calcium atomic beam ejected from the furnace is in the ground state, and then the calcium atomic beam interacts with the clock transition 657 nm laser in the form of a single interaction region or multiple interaction regions at the action region. Parts of the atoms are stimulated to the $^3P_1$ state, and these stimulated atoms emit the fluorescence by the form of the spontaneous emission after leaving the interaction region. However, the frequency of the spontaneous emission is 400 Hz, or the excursion of the atoms with a velocity of about 800 meters per second is about 20 cm in the average lifetime period. The traditional method is detecting the 657 nm weak fluorescence and the signal-to-noise ratio is very low. In the present invention, as shown in FIG. 2, there is a beam of 423 nm laser in the detection region that excites the ground state atoms to the $^1P_1$ state. The atoms excited to the $^1P_1$ state may emit a photon back to the ground state in the average period of about 5 ns. This indicates that each of the atoms in the ground state can emit 5000 photons spontaneously in 2 cm detection region. Thereby, it ensures that the photoelectric detector in the detection region can detect any atom in the ground state passing the detection region. By modulating the clock transition 657 nm laser, after the signal explored by the photoelectric receiving system passes the phase detector and the filter and is amplified, the output error signal locks the clock transition 657 nm laser on the 657 nm transition spectrum of the calcium atoms so as to implement the calcium atomic clock at optical frequency finally.

As follows the structure with the pumping in advance is explained. The formed calcium atomic beam ejected from the furnace is in the ground state. The calcium atomic beam acts with a beam of 657 nm pump laser before entering the action region. The pumping laser power is adjusted to satisfy the it pulse transition so as to make the atoms with a velocity nearby the highest velocity pump to the $^3P_1$ excited state. And then the calcium atomic beam interacts with the clock transition 657 nm laser in the form of a single interaction region or multiple interaction regions at the interaction region. Based on the process of the stimulated radiation, parts of the atoms return to the ground state after stimulation. After these excited atoms stimulated to return to the ground state leave the interaction region, as shown in FIG. 2, the atoms in the ground state is excited to the $^1P_1$ state by a beam of 423 nm laser at the detection region. As the same with the above, the atoms excited to the $^1P_1$ state may emit a photon back to the ground state in the average period of about 5 ns. This indicates that each of the atoms in the ground state can emit 5000 photons spontaneously at 2 cm detection region. Thereby, it ensures that the photoelectric detector in the detection region can detect any atom in the ground state passing the detection region. By modulating the clock transition 657 nm laser, after the signal explored by the photoelectric receiving system passes the phase detector and the filter and is amplified, the output error signal locks the clock transition 657 nm laser on the 657 nm transition spectrum of the calcium atoms so as to implement the calcium atomic clock at optical frequency finally.

To be brief, the primary difference between the structure with the pumping in advance and the structure without the pumping in advance is the difference between excited absorption of the atoms and stimulated emission of the atoms at the interaction region.

As shown in FIG. 2, when the detection method that an angle is formed between the detection laser beam and the atomic beam direction chooses the atoms with certain velocity group on the atomic clock at optical frequency based on the atomic beam type for detecting is used, the atoms with the certain velocity group are chosen for detection by adjusting the frequency and line width of the detection laser or the divergence angle of the laser beam. Thereby, the frequency shift of the clock transition frequency of the atomic clock related to the Doppler Effect can be decreased and corrected. Here a technology is provided for improving the accuracy of the atomic clock at optical frequency based on the atomic beam type. The size of the angle between the atomic beam direction and the detection laser beam may be adjusted properly according to specific needs so as to obtain the optimal atomic clock performance.

For the particles beam flow, the widening and moving of the spectral line caused by the Doppler Effect are reduced by using the mechanical slit or small diaphragm and reducing the transverse velocity distribution of the beam flow medium by using the laser cooling technology.

The unevenness of the environment electromagnetic field and the widening and moving of the spectral line caused by the fluctuation are reduced by adjusting the evenness of the adscititious electromagnetic field. The intensity of the atomic beam flow is controlled and determined by the temperature of the oven. The signal-to-noise ratio may be adjusted by adjusting the intensity of the particles beam flux.

The detection laser is locked on the fluorescence spectrum of the atomic beam. The fluorescence spectrum structure of the laser device 5 before pumping the laser beam may not influence any performance of the clock.

The structure of the small atomic clock at optical frequency based on the atomic beam with high performance implemented by the present invention, with reference to FIG. 2, is described as follows.

The invention mainly includes a vacuum cavity 2 where high vacuum is maintained by a ion pump, an atomic oven 1, a collimation slit 10, a pump laser 13, laser holophote 11 and laser holophote 12 and a controlling circuit 6. A necessary optical window is opened at the proper position of the vacuum cavity so as to enable the laser beam 5, 13 and 14 to pass. The atomic beam 8 is generated after the atomic pile 1 is heated. The current of the heater wire and the temperature of the atomic pile 1 are adjusted by the controlling circuit 6. The clock laser is generated by the laser device 4. The frequency shifter is indicated as 3 and the lens is indicated as 7. The signal of the detector 9 is used to control the clock laser device 4 after being outputted. The photon shutter is indicated as 15.

The invention needs to be implemented in the high vacuum cavity 2. The high vacuum in the vacuum cavity secularly needs to be maintained by the ion pump connected to the high vacuum cavity. The necessary optical window is opened at the proper position of the vacuum cavity 2 so as to enable laser output or laser input at the vacuum cavity 2 when the laser is coupled. The optical fiber may also be set inside the vacuum cavity and the outputted laser is coupled by the optical fiber.

The high vacuum cavity is provided with the atomic oven 1 which can generate the atomic beam. The temperature of the atomic pile is determined by the factors such as the used atoms and the needed atoms flux and so on.

The cat eye optical path system composed of the holophote 11, the holophote 12 and the lens 7 is placed at the cross position which is vertical with the direction of the atomic beam 8 inside the vacuum cavity 2, and is adjusted by corresponding fine adjusting mechanical device.

The connection relation, the function and effect, and the needed requirement condition of each part of the structure of the small atomic clock at optical frequency based on the atomic beam with high performance are as follows.

The high vacuum cavity 2 and the ion pump connected to the high vacuum cavity 2 are used to ensure that the whole small atomic clock at optical frequency based on the atomic beam with high performance as shown in FIG. 1 can secularly work in a high vacuum state and the vacuum degree is better than $10^{-2}$ torr.

The length of the vacuum tube can be less than 50 cm. The volume of the ion pump is less than 1 liter. Anyway, the requirement that the vacuum degree is better than $10^{-2}$ torr is satisfied by the harmony between the volume of the vacuum tube and the pumping velocity of the ion pump.

The oven body temperature of the atomic oven 1 and the area of the pile mouth hole determine the flux of the atomic beam that can be used, that is, how many atoms can be used per unit time. The oven hole is composed of a long tubule. The length of the long tubule is 0.5 to 2 cm and the caliber is 0.1 to 0.5 mm, and they are determined concretely by the requirements such as the flux of the atomic beam and the divergence angle and so on. In order to increase the flux without increasing the divergence angle at the same time, the oven hole can be composed of a long tubule array.

After the atomic beam is ejected out from the oven hole of the atomic oven with high temperature, the atomic beam may be further collimated by using the small hole diaphragm 10. And the transversal divergence of the atomic beam may also be performed the laser collimation by using the laser cooling principle.

Figure 3:
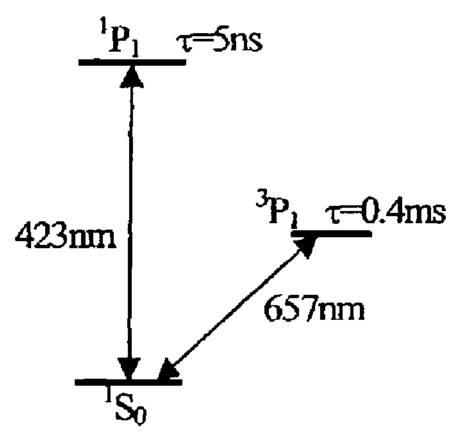
FIG. 3 is the view illustrating the energy level of an optical frequency standard of the calcium atoms of the generating device of an atomic clock at optical frequency based on atomic beam according to the present invention.
Figure 4:
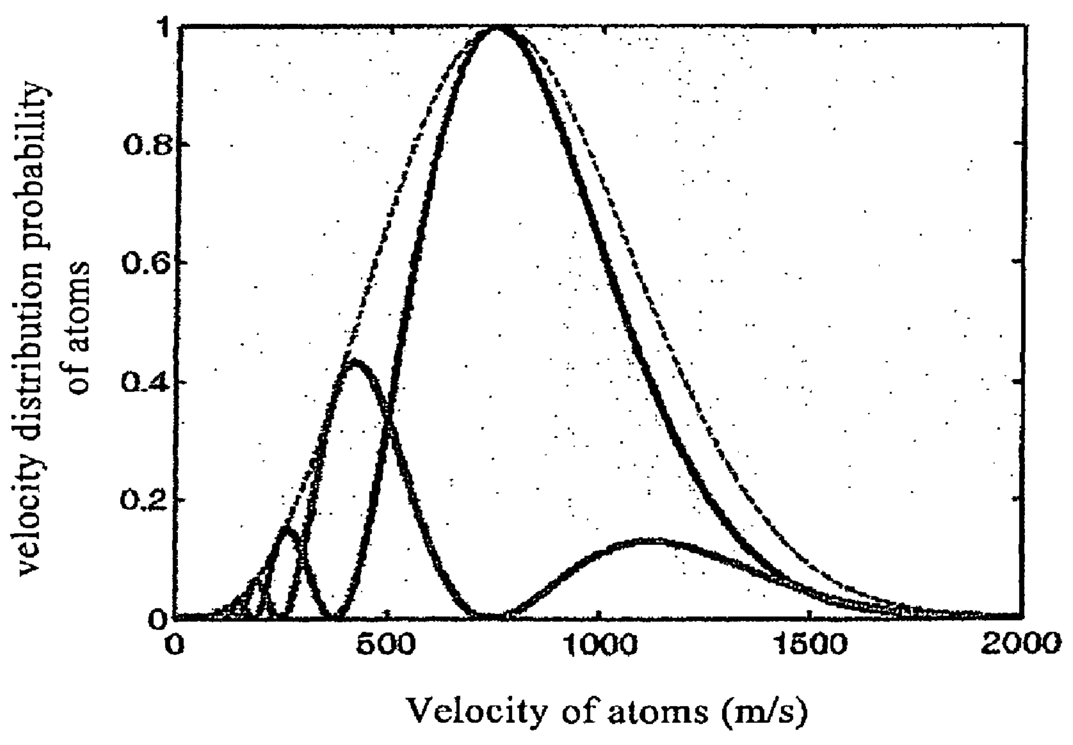
FIG. 4 is the view illustrating the layout probability of atoms with different velocity in the ground state and the excited state of the clock transition energy level after passing the pump region in the generating device of an atomic clock at optical frequency based on atomic beam according to the present invention.

With reference to FIG. 3, after collimation, the atomic beam enters the pump region in succession and interacts with the pump light 13. The function of the pump light 13 is to pump the atoms in the ground state to the excited state. The velocity distribution of the atoms in the ground state and the excited state after excitation is shown in FIG. 4. The velocity distribution of the atomic beam is indicated by the broken line in the figure. The atoms in the excited state are indicated by the real line with a higher peak value, which indicates that 77% of the atoms are pumped to the excited state. Moreover, the atoms in the ground state are indicated by the broken line with a lower peak value, which indicates 22% of the atoms.

The optical source of the pump light 13 can be provided by the semiconductor laser device of which the cavity is stable. The frequency of the pump light 13 is locked on the special value of the needed atom spectrum, which is implemented by the circuit 6.

The present invention improves the atom detection efficiency by using a detection method of electron shelving detection, that is, using the laser corresponding to one strong transition line related to the transition energy level of the atomic clock for detection. Taking the calcium atoms as an example, the laser of which the wavelength is 423 nm stimulates the $^1S_0$ ground state atoms of the clock transition to the first excited state $^1P_1$ of the atoms singlet state at the detection region. The probability of atom spontaneous emission in the first excited state $^1P_1$ is very high, up to 34 million photons radiated per atom per second. Thereby it ensures that each of the atoms which need to be detected can be measured in a 100% rate. Secondly, the signal fringe contrast is improved to increase the signal-to-noise ratio by using the detection method that an angle is formed between the detection laser beam and the atomic beam chooses the atoms with the certain velocity group on the atomic clock at optical frequency based on the atomic beam type for detection. Thirdly, the atoms are firstly pumped to the excited state of the clock transition by using the advance pump technology so as to implement the atomic clock at optical frequency based on new atomic beam type based on the process of emitting the electromagnetic wave by stimulating the atoms. Because the signal-to-noise ratio is improved greatly, the atomic clock at optical frequency based on the calcium beam implemented by the present invention is two orders of magnitude better than that of the USA commercial HP5071 small cesium clock in terms of stability and one order of magnitude better in terms of accuracy. Therefore, the present invention is provided with the following advantages compared with all the convention generating device and generating method of the atomic clock at optical frequency based on the atomic beam type.

1. The atom detection efficiency is improved from about 1% to about 100%.

2. The atoms with a certain velocity group are chosen for detection by adjusting the frequency and line width of the detection laser or the divergence angle of the laser beam. Thereby, the frequency shift of the clock transition frequency of the atomic clock related to the Doppler Effect can be calibrated by rule and line. Therefore, a method for improving the accuracy of the atomic clock at optical frequency based on the atomic beam type is provided.

3. The atomic clock at optical frequency based on new atomic beam type based on the process of emitting the electromagnetic wave by stimulating the atoms is implemented.

Finally, for this small atomic clock at optical frequency based on atomic beam with high performance, various changing and remodeling which is not divorced from the scope of the present invention limited by the appended claims may be worked out. More specifically, it must be understood that the present invention is not limited to one transition spectral line of one special kind of atoms. However, the present invention is adapted to all the atoms, molecules or ions that are provided with the similar energy level structure as long as the kind of particles has a transition with small line width which can be used for the atomic clock at optical frequency and has a related corresponding energy level that can implement high efficient detection by using the technology of the present invention.

Finally, it should be understood that the above embodiments are only used to explain, but not to limit the technical solution of the present invention. In despite of the detailed description of the present invention with referring to above preferred embodiments, it should be understood that various modifications, changes or equivalent replacements can be made by those skilled in the art without departing from the spirit and scope of the present invention and covered in the claims of the present invention.

What is claimed is:

1. A method for generating an atomic clock at an optical frequency based on an atomic beam, comprising:

ejecting an atomic beam from a mouth of an oven after heating an atomic oven in a vacuum chamber;

transferring particles in the atomic beam from a ground state of clock transition to an excited state of the clock transition by a pump laser having a frequency corresponding to a frequency of the clock transition in an adiabatic passing mode to generate a first excited atomic beam, and the first excited atomic beam being interacted with a clock laser having a frequency corresponding to the frequency of the clock transition to generate a second excited atomic beam;

the second excited atomic beam passing a detection region with a detection laser, wherein a frequency of the detection laser corresponds to one strong transition spectral line related to a clock transition energy level of the atomic clock, and the frequency of the detection laser is higher than the frequency of the clock laser, particles in the second excited atomic beam give off fluorescence photons of spontaneous emission after the second excited atomic beam moves to the detection region and interacts with the detection laser, and the emitted fluorescence photons is detected by a photoelectric receiving system; and modulating the frequency of the clock laser which is used to detect frequency of the clock transition, and locking the frequency of the clock laser at spectrum of the clock transition according to the detected fluorescence photons so as to implement the atomic clock.

2. The method according to claim 1, wherein an angle is formed between said detection laser and the atomic beam, and atoms with a certain velocity group are chosen for detection by adjusting frequency and line width of the detection laser or adjusting a divergence angle of the laser beam.

3. The method according to claim 2, wherein the particles in the atomic beam comprises different kinds of atoms, molecules or ions.

4. The method according to claim 1, wherein the particles in the atomic beam comprises different kinds of atoms, molecules or ions.

5. The method according to claim 1, wherein the atomic oven is a calcium atomic oven, and the wave length of the detection laser is 423 nm.

6. The method according to claim 1, wherein the atomic oven is a magnesium atomic oven, and the wave length of the detection laser is 285 nm.

7. An atomic clock at an optical frequency based on an atomic beam, comprising:

a vacuum cavity provided with an atomic oven in the vacuum cavity, a pump laser device and a cat eye optical path vertical with an atomic beam and composed of two holophotes and two lenses therein;

a servo circuit connected to said atomic oven for controlling temperature of the atomic oven;

a detection laser;

a clock laser; and a photoelectric detecting device;

wherein the atomic oven is placed inside the vacuum cavity and temperature of the atomic oven is controlled by the connected servo circuit; the atomic beam generated after heating the atomic oven inside the vacuum cavity enters a pump region to interact with a pump laser emitted by the pump laser device with a frequency corresponding to a frequency of the clock transition to generate a treated atomic beam, and then the treated atomic beam enters an interaction region formed by the cat eye optical path to interact with the clock laser having a frequency corresponding to frequency of the clock transition; at the offside of the interaction region, the treated atomic beam enters a detection region with the detection laser after being interacted with the clock laser to interact with the detection laser to emit fluorescence photons, wherein frequency of the detection laser corresponds to one strong transition spectral line related to an atomic's clock transition energy level; and the emitted fluorescence photons are received by the photoelectric detecting device placed in a detection region, transferred to the connected servo circuit and fed back to the clock laser by the servo circuit, and finally the frequency of the clock laser is stabilized to the frequency corresponding to the clock transition spectral line according to the emitted fluorescence photons.

8. The atomic clock according to claim 7, wherein said servo circuit is a servo circuit for a system to control the performance of output frequency of the atomic clock.

9. The atomic clock according to claim 7, wherein said detection laser and the clock laser device are provided with a frequency automatic controlling circuit.

10. The atomic clock according to claim 7, wherein a small hole diaphragm is set in said vacuum cavity for collimating the atomic beam.

11. The atomic clock according to claim 7, wherein said vacuum cavity is provided with multiple optical windows for input and output of the laser.

12. The atomic clock according to claim 7, wherein the vacuum degree inside said vacuum cavity is greater than 10-2 torr.

13. A method for generating an atomic clock at an optical frequency based on an atomic beam, comprising:

ejecting an atomic beam from a vacuum chamber;

transferring particles in the atomic beam from a ground state of clock transition to an excited state of clock transition by a pump laser having a frequency corresponding to a frequency of the clock transition in an adiabatic passing mode to generate a first excited atomic beam;

interacting the first excited atomic beam with a clock laser having a frequency corresponding to the frequency of the clock transition to generate a second excited atomic beam;

passing the second excited atomic beam through a detection region where the second excited atomic beam is further excited by a detection laser, wherein a frequency of the detection laser corresponds to one strong transition spectral line related to a transition energy-level of the atomic clock, and the frequency of the detection laser is higher than the frequency of the clock laser, and particles in the second excited atomic beam gives off fluorescence photons of spontaneous emission after the second excited atomic beam moves to the detection region and is further excited by the detection laser, and the emitted fluorescence photons is detected by a photoelectric receiving system; and modulating a frequency of the clock laser which is used to detect the frequency of the clock transition, and locking the frequency of the clock laser at a spectrum of the clock transition according to the detected fluorescence photons so as to implement the atomic clock.

14. The method according to claim 13, wherein the atomic beam is a calcium atomic beam, and the wave length of the clock laser is 657 nm and the wave length of the detection laser is 423 nm.

15. The method according to claim 13, wherein the atomic beam is a magnesium atomic beam, and the wave length of the clock laser is 657 nm and the wave length of the detection laser is 285 nm.

* * * * *